(12) United States Patent
Yoon et al.

(10) Patent No.: US 7,655,535 B2
(45) Date of Patent: Feb. 2, 2010

(54) METHOD FOR FABRICATING SEMICONDUCTOR DEVICE HAVING TRENCH ISOLATION LAYER

(75) Inventors: Hyo Seob Yoon, Gyeonggi-do (KR); Woo Jin Kim, Gyeonggi-do (KR); Ok Min Moon, Gyeonggi-do (KR); Ji Yong Park, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 172 days.

(21) Appl. No.: 11/647,929

(22) Filed: Dec. 29, 2006

(65) Prior Publication Data

US 2008/0003769 A1    Jan. 3, 2008

(51) Int. Cl.
    *H01L 21/76* (2006.01)
(52) U.S. Cl. ............... 438/435; 438/424; 257/E21.545
(58) Field of Classification Search ............ 438/424, 438/435; 257/E21.545
    See application file for complete search history.

(56) References Cited

U.S. PATENT DOCUMENTS

| | | | |
|---|---|---|---|
| 6,486,517 B2 * | 11/2002 | Park | 257/374 |
| 7,064,072 B1 | 6/2006 | Ting et al. | 438/700 |
| 2002/0142616 A1 * | 10/2002 | Giewont et al. | 438/745 |
| 2003/0220708 A1 * | 11/2003 | Sahin et al. | 700/121 |
| 2004/0126972 A1 * | 7/2004 | Dong et al. | 438/259 |
| 2005/0136618 A1 * | 6/2005 | Lee et al. | 438/435 |
| 2005/0250298 A1 * | 11/2005 | Bauer | 438/481 |
| 2006/0043521 A1 * | 3/2006 | Trivedi et al. | 257/499 |

FOREIGN PATENT DOCUMENTS

| | | |
|---|---|---|
| JP | 2001-015618 | 1/2001 |
| KR | 10 2005 0010251 A | 1/2005 |
| KR | 10 2005 0052006 A | 6/2005 |

* cited by examiner

*Primary Examiner*—Bradley K Smith
(74) *Attorney, Agent, or Firm*—Marshall, Gerstein & Borun LLP

(57) ABSTRACT

A method for fabricating a device isolation structure of a semiconductor device includes the steps of forming a pad oxide layer and a pad nitride layer over a semiconductor substrate including a cell region and a dummy region, etching a portion of the pad nitride layer, the pad oxide layer and the semiconductor substrate to form a trench, forming a sidewall oxide layer over the sidewalls of the trench; removing the sidewall oxide layer in the dummy region, forming a silicon nitride layer over the sidewalls of the sidewall oxide layer both in the cell region and in the dummy region, filling the trench with an insulating layer, polishing the insulating layer to expose the pad nitride layer, and removing the pad nitride layer.

6 Claims, 4 Drawing Sheets

METHOD FOR FABRICATING SEMICONDUCTOR DEVICE HAVING TRENCH ISOLATION LAYER

CROSS-REFERENCE TO RELATED APPLICATION

The priority of Korean patent application number 10-2006-0061497 filed Jun. 30, 2006, which is incorporated by reference in its entirety, is hereby claimed.

BACKGROUND OF THE INVENTION

1. Field of the Invention

The invention relates to a method for fabricating a semiconductor device and, more specifically, to a method for fabricating a semiconductor device having a trench isolation layer.

2. Related Technology

General device isolation layers serve to insulate adjacent devices from each other. In particular, trench isolation layers are currently used. Methods for forming the trench isolation layers are well-known in the art. For example, as shown in FIG. 1A, a pad oxide layer and a pad nitride layer are sequentially formed on a substrate 100. Then, the resulting structure is subjected to patterning using a hard mask layer pattern, to form a structure in which a pad oxide pattern 110 and a pad nitride pattern 120 are sequentially laminated, in this order. A trench isolation region in the surface of the substrate 100, on which a trench isolation layer is to be formed, is exposed through the pad oxide pattern 110 and the pad nitride pattern 120. An exposed region of the substrate 100 is etched to a predetermined depth, to form a trench 130. Side walls of the trench 130 are damaged during the etching. Accordingly, in order to repair the etching damage, a side wall oxide layer 140 is formed, and a liner nitride layer 150 is then formed on the side wall oxide layer 140.

Next, as shown in FIG. 1B, a nitride layer 160 is formed such that the trench 130 is filled with the nitride layer 160, and the hard mask layer pattern is removed, thereby exposing the surface of the pad nitride pattern 120. The exposed pad nitride pattern 120 and the pad oxide layer pattern 110 are sequentially removed. The removal of the hard mask layer pattern to expose the surface of the pad nitride pattern 120 is carried out by chemical mechanical polishing (CMP). Also, the removal of the pad nitride layer pattern 120 is carried out by wet etching using a phosphorus solution.

In the process of forming a trench isolation layer, as described above, the substrate 100 may include a dummy region and a cell region. The dummy region corresponds to a wafer peripheral portion. In some cases, the dummy region may be an incompletely polished region after CMP, rather than the wafer peripheral portion. When the CMP is conducted to remove the hard mask layer pattern, the wafer peripheral portion tends to be polished incompletely, as compared to a wafer central portion. This is the reason that the size of a dummy pattern formed in the dummy region is relatively larger than that of a cell pattern formed in the cell region, and the CMP is made based on the cell pattern. Accordingly, the surface of the pad nitride layer pattern 120 in the cell region is exposed by CMP, but the surface of the pad nitride layer pattern 120 in the dummy region may not be exposed by CMP. As a result, in the dummy region, the sidewall oxide layer 140 may remain on the pad nitride layer pattern 120 after the CMP. When the sidewall oxide layer 140 remains on the pad nitride layer pattern 120, the pad nitride layer pattern 120 may not be removed due to the presence of the sidewall oxide layer 140 during the subsequent wet etching for removal of the pad nitride layer pattern 120.

BRIEF SUMMARY OF THE INVENTION

A method for fabricating a device isolation structure of a semiconductor device includes the steps of forming a pad oxide layer and a pad nitride layer over a semiconductor substrate including a cell region and a dummy region; etching a portion of the pad nitride layer, the pad oxide layer and the semiconductor substrate to form a trench; forming a sidewall oxide layer over the sidewalls of the trench; removing the sidewall oxide layer in the dummy region; forming a silicon nitride layer over the sidewalls of the sidewall oxide layer both in the cell region and in the dummy region; filling the trench with an insulating layer; polishing the insulating layer to expose the pad nitride layer; and removing the pad nitride layer.

The removing the sidewall oxide layer in the dummy region preferably further includes forming a photoresist pattern over the sidewall oxide layer in the cell region such that the dummy region is exposed; cleaning the sidewall oxide layer in the exposed dummy region to remove the sidewall oxide layer; and removing the photoresist pattern.

The cleaning is preferably performed by wet cleaning using an oxide layer etching solution.

The wet cleaning solution is preferably HF or BOE.

The cleaning is preferably performed by dry cleaning using a spin or marangoni technique.

The dry cleaning is preferably performed at a temperature of 25° C. or below.

The photoresist pattern is preferably deposited to a thickness of 2 μm or below.

The pad nitride layer is preferably removed using a phosphorus solution.

A device isolation structure of a semiconductor device comprising a semiconductor substrate including cell region and dummy region; a trench in the semiconductor substrate; a sidewall oxide layer over the sidewall of the trench in the cell region; and a silicon nitride layer over the sidewall of the trench in the dummy region and over the sidewall oxide layer in the cell region.

DETAILED DESCRIPTION OF THE INVENTION

According to one embodiment of the invention, prior to forming a silicon nitride liner after a trench and a sidewall oxide layer are sequentially formed, the sidewall oxide layer which remains on a pad nitride layer pattern in a dummy region is selectively removed. Accordingly, the pad nitride layer pattern in a dummy region can be readily exposed during subsequent chemical mechanical polishing (CMP) for surface exposure of the pad nitride layer pattern. As a result, it is possible to prevent the pad nitride layer pattern from remaining in the dummy region.

Figure 1A:
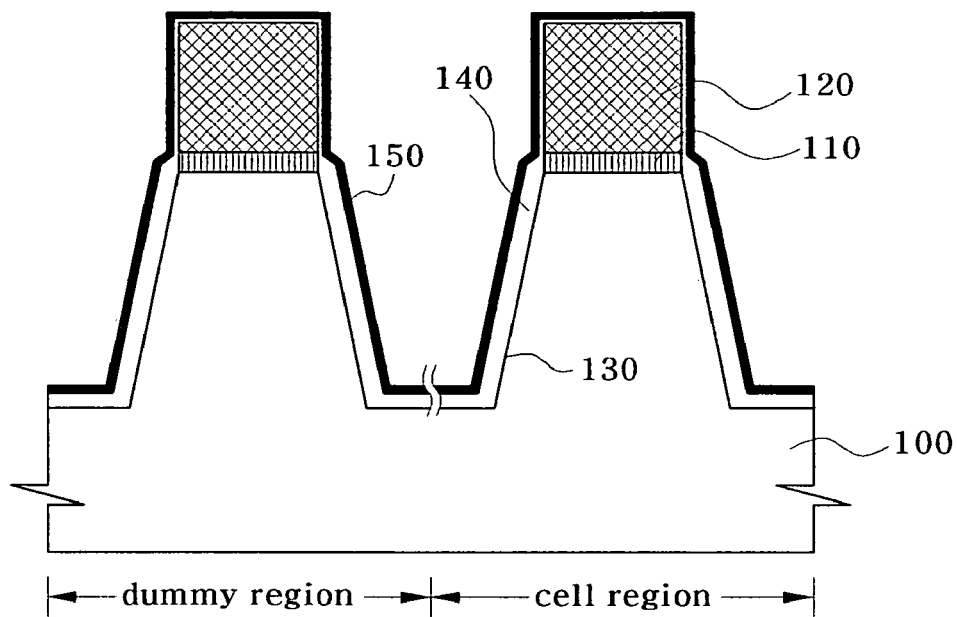
FIGS. 1A and 1B are cross-sectional views illustrating a conventional method for fabricating a semiconductor device.
Figure 1B:
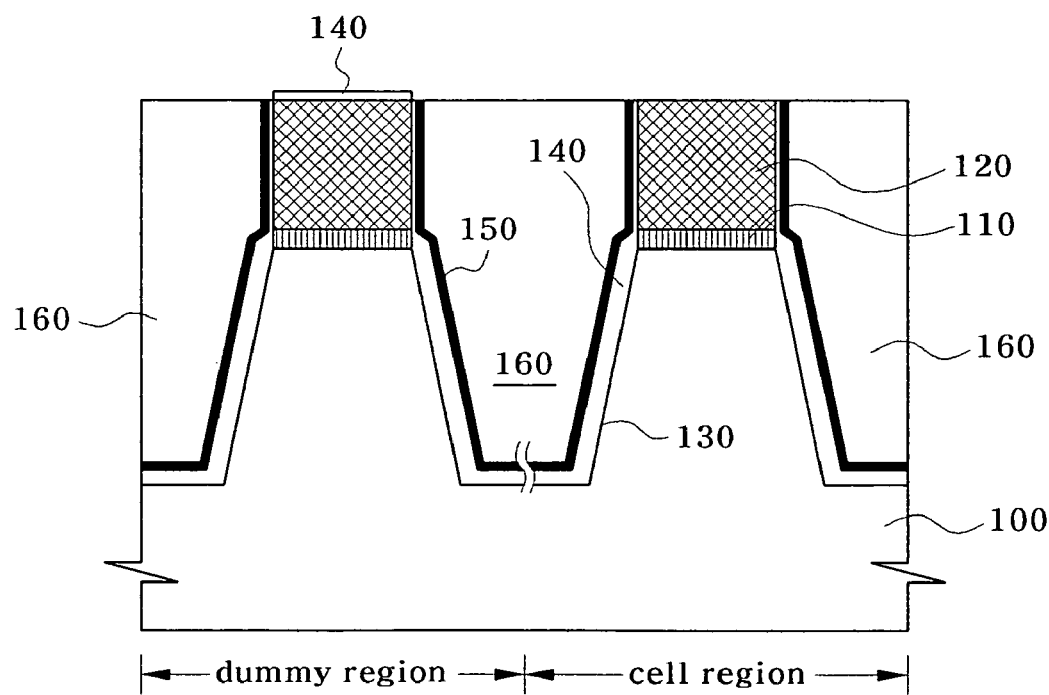
Figure 2:
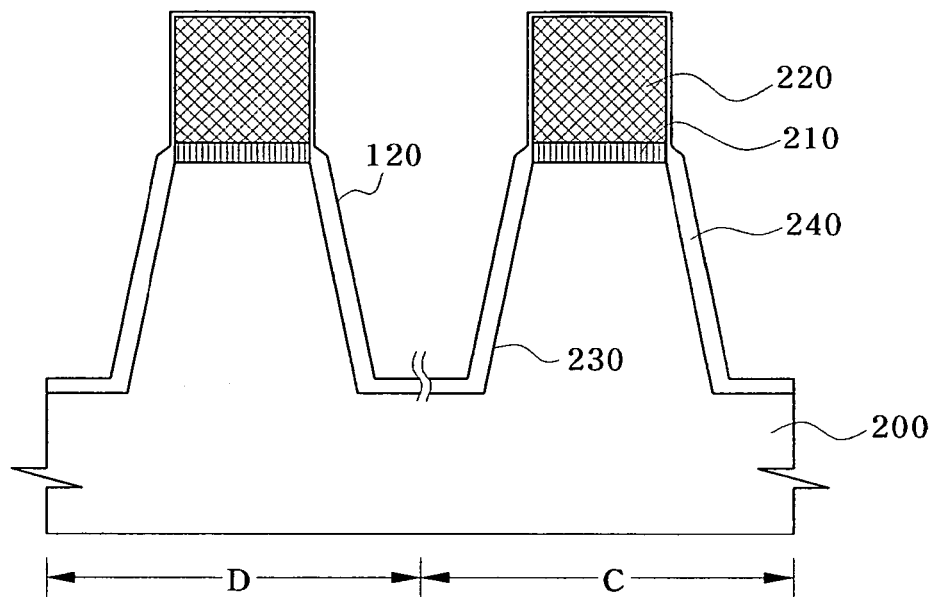
FIGS. 2 to 5 are cross-sectional views illustrating a method for fabricating a semiconductor device according to the invention.

In more detail, as shown in FIG. 2, a pad oxide layer and a pad nitride layer are sequentially formed on a substrate 200 including a cell region C and a dummy region D. At this time, the cell region C is disposed in a central portion of a wafer, and the dummy region D is disposed in a peripheral portion of the wafer. As well-known in the art, the dummy region D is where a dummy pattern is to be formed. In the dummy region D, patterns for checking devices arranged in the cell region C are formed, rather than actual circuit devices.

Next, the pad oxide layer and pad nitride layer are subjected to patterning, thereby forming a pad oxide layer 210 and a pad nitride layer 220 used as a device isolation mask, respectively. The device isolation mask including the pad oxide layer 210 and the pad nitride layer 220 laminated in this order allows the surface of a device isolation region to be exposed. The substrate 200 is etched using the device isolation mask as an etching mask, to form a trench 230 to a predetermined depth. In order to repair a trench sidewall damaged from the etching for the formation of the trench 230, a sidewall oxide layer 240 is formed on the surface of the trench 230. The sidewall oxide layer 240 is preferably a thermal oxide layer. At this time, the sidewall oxide layer 240 is preferably also formed in a small thickness on the surface of the pad nitride layer 220.

Figure 3:
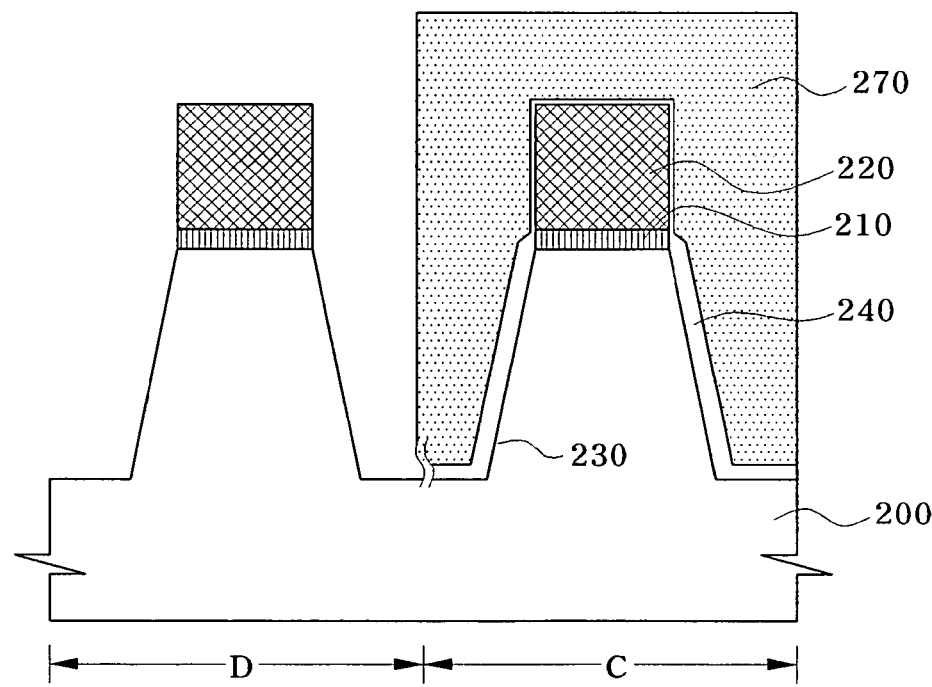
Figure 6:
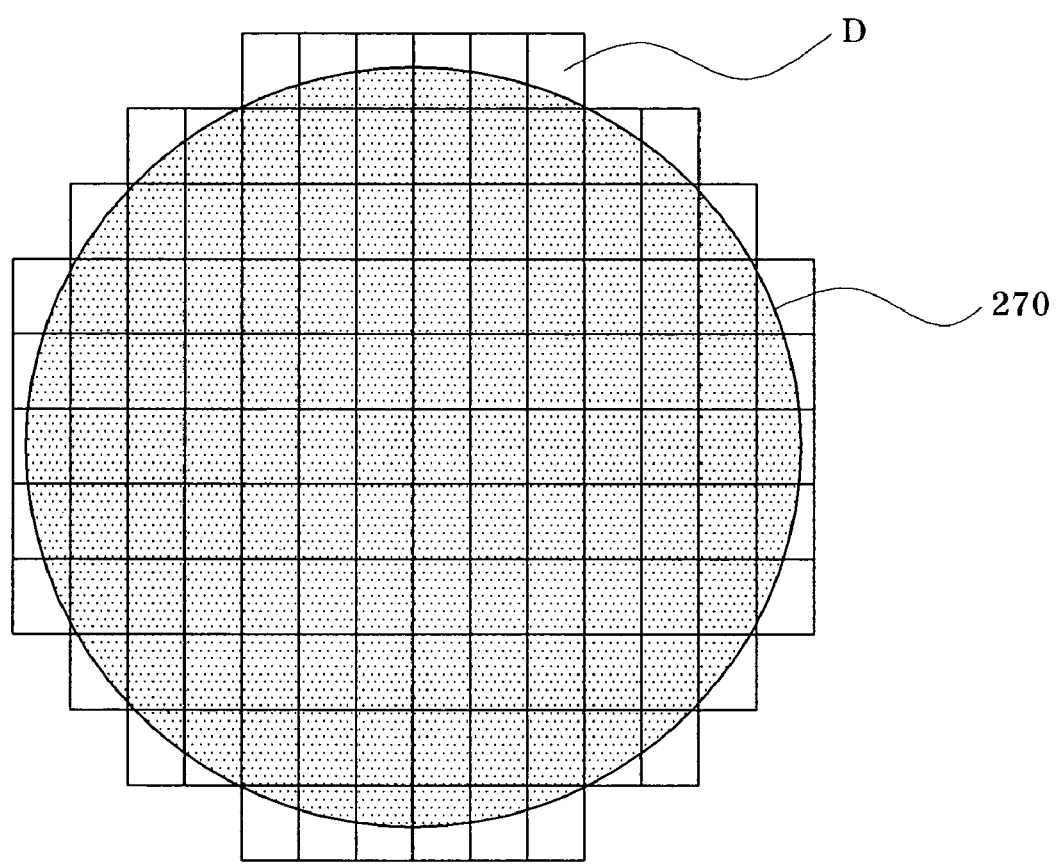
FIG. 6 is a plan view illustrating a wafer, on which a photoresist pattern is formed, such that dummy regions are exposed according to an embodiment of the invention.

Referring to FIG. 3, to remove the sidewall oxide layer 240 formed on the surface of the pad nitride layer 220 in the dummy region D, (i.e., the wafer peripheral region), a photoresist pattern 270 is formed in the cell region C, such that the dummy region D is exposed through the photoresist pattern 270. That is, as shown in FIG. 6, the photoresist pattern 270 is formed in the cell region C (i.e., the wafer central region), preferably at a thickness of 2 μm or less, thereby exposing the dummy region D (i.e., the wafer peripheral region). Next, the sidewall oxide layer 240 in the exposed dummy region D is removed using an oxide layer etching solution such as a wet etching solution (i.e., preferably a hydrofluoric acid (HF) solution and a buffered oxide etchant (BOE)), or by dry cleaning by using a spin or marangoni technique, preferably at 25° C. or below. At this time, since the cell region C is covered with the photoresist pattern 270, it is hardly affected by etching.

Figure 4:
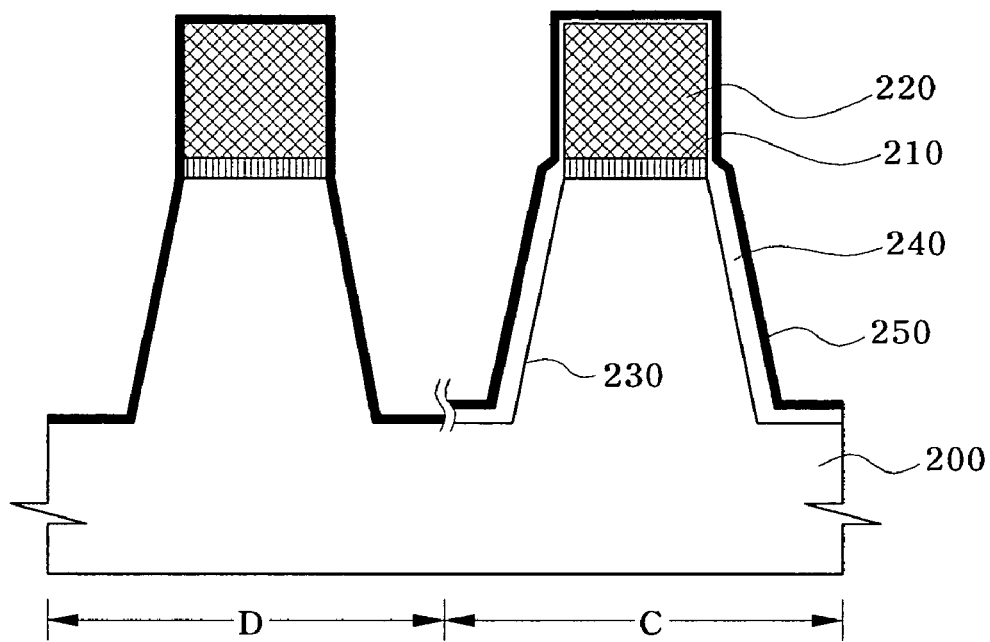
Figure 5:
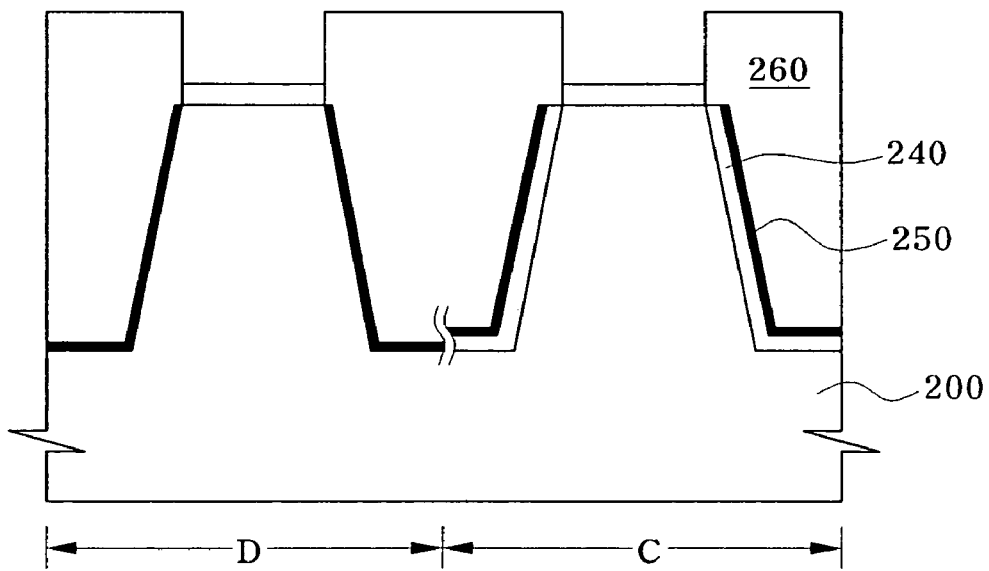

Referring to FIG. 4, the photoresist pattern 270 is removed. Then, a silicon nitride liner 250 is formed on the surface of the resulting structure. As shown in FIG. 5, an insulation layer 260 is formed such that the trench 230 is filled with the insulation layer 260. The resulting structure is subjected to planarization by chemical mechanical polishing (CMP) such that the pad nitride layer pattern is exposed in both the cell region C and the dummy region D. At this time, although the dummy region D is incompletely planarized, as compared to the cell region C, since the sidewall oxide layer 210 arranged on the pad nitride layer pattern 220 in the dummy region D has been already removed, non-exposure of the pad nitride layer pattern 220 in the dummy region does not occur.

Next, the exposed pad nitride layer pattern 220 is removed using a phosphorus solution, thereby forming a trench isolation layer. As described above, since the pad nitride layer pattern 220 in the dummy region D is also exposed, the pad nitride layer pattern 220 in the dummy region D as well as the cell region C is removed by etching using the phosphorus solution.

Although the invention has been described herein in detail with reference to preferred embodiments, these embodiments do not serve to limit the invention, and various changes and modifications may be made thereto without departing from the spirit and scope of the invention as defined in the appended claims.

What is claimed is:

1. A method for fabricating a device isolation structure of a semiconductor device comprising:
    forming a pad oxide layer and a pad nitride layer over a semiconductor substrate including a cell region and a dummy region, wherein a pattern in the dummy region is larger than a pattern in the cell region;
    etching a portion of the pad nitride layer, the pad oxide layer, and the semiconductor substrate to form a trench;
    forming a sidewall oxide layer over the pad nitride layer and the sidewalls of the trench;
    removing the sidewall oxide layer in the dummy region;
    forming a silicon nitride layer over the pad nitride layer and the sidewalls of the trench in the dummy region, and over the sidewalls of the sidewall oxide layer in the cell region;
    filling the trench with an insulating layer;
    polishing the insulating layer and the sidewall oxide layer on the pad nitride layer in the cell region, to expose the pad nitride layer, wherein the polishing is performed based on the pattern in the cell region; and
    removing the pad nitride layer.

2. The method according to claim 1, wherein the removing the sidewall oxide layer in the dummy region further includes:
    forming a photoresist pattern over the sidewall oxide layer in the cell region such that the dummy region is exposed;
    cleaning the sidewall oxide layer in the exposed dummy region to remove the sidewall oxide layer; and
    removing the photoresist pattern.

3. The method according to claim 2, comprising performing the cleaning step by wet cleaning using an oxide layer etching solution.

4. The method according to claim 3, wherein the wet cleaning solution is HF or BOE.

5. The method according to claim 2, wherein a thickness of the photoresist pattern to a thickness of 2 μm or less.

6. The method according to claim 1, comprising removing the pad nitride layer using a phosphorus solution.

* * * * *